(12) United States Patent
Beerling et al.

(10) Patent No.: US 7,158,159 B2
(45) Date of Patent: Jan. 2, 2007

(54) MICRO-MACHINED NOZZLES

(75) Inventors: Timothy Beerling, San Francisco, CA (US); Marco Aimi, Goleta, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 47 days.

(21) Appl. No.: 11/003,067

(22) Filed: Dec. 2, 2004

(65) Prior Publication Data

US 2006/0118511 A1   Jun. 8, 2006

(51) Int. Cl.
*B41J 2/14* (2006.01)
(52) U.S. Cl. .................... 346/47; 428/131; 428/358
(58) Field of Classification Search ............ None
See application file for complete search history.

(56) References Cited

U.S. PATENT DOCUMENTS

| | | | | |
|---|---|---|---|---|
| 4,791,436 A | * | 12/1988 | Chan et al. | 347/47 |
| 4,829,319 A | * | 5/1989 | Chan et al. | 347/47 |
| 5,417,897 A | * | 5/1995 | Asakawa et al. | 264/400 |
| 5,786,832 A | * | 7/1998 | Yamanaka et al. | 347/45 |
| 5,818,479 A | * | 10/1998 | Reinecke et al. | 347/47 |
| 5,875,967 A | | 3/1999 | Ruth, III | |
| 6,132,028 A | * | 10/2000 | Su et al. | 347/47 |
| 6,290,331 B1 | * | 9/2001 | Agarwal et al. | 347/47 |
| 6,579,499 B1 | | 6/2003 | Kennedy et al. | |

OTHER PUBLICATIONS

Ui-Chong Yi and Chang-Jin Kim, "Geometric Surface Modification of Nozzles for Complete Transfer of Liquid Drops." Solid-State Sensor, Actuator and Microsystems Workshop; Hilton Head Island, South Carolina, Jun. 6-10, 2004, pp. 164-167.

Bo He and Junghoon Lee, "Dynamic Wettability Switching by Surface Roughness Effect." IEEE, Micro Electro Mechanical Systems (MEMS), pp. 120-123, Copyright 2003.

* cited by examiner

*Primary Examiner*—Allan Olsen

(57) ABSTRACT

A micro-machined nozzle includes a substrate having a hole formed on a first side that extends partially through a thickness dimension of the substrate and a nozzle orifice formed on a second opposite side that communicates with the hole. The nozzle orifice has at least a portion of its interior wall serrated. A method of fabricating a micro-machined nozzle includes the steps of etching a first side of a silicon substrate to form a hole that extends partially through a thickness dimension of the substrate and etching a second opposite side of the silicon substrate to form a serrated nozzle orifice that communicates with the hole.

17 Claims, 3 Drawing Sheets

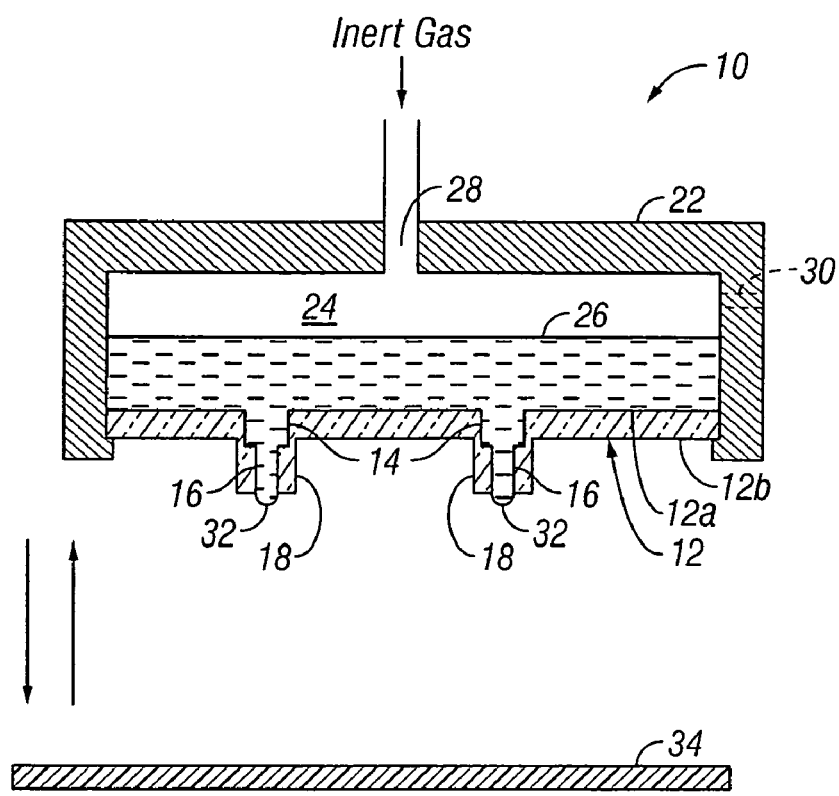
FIG. 1
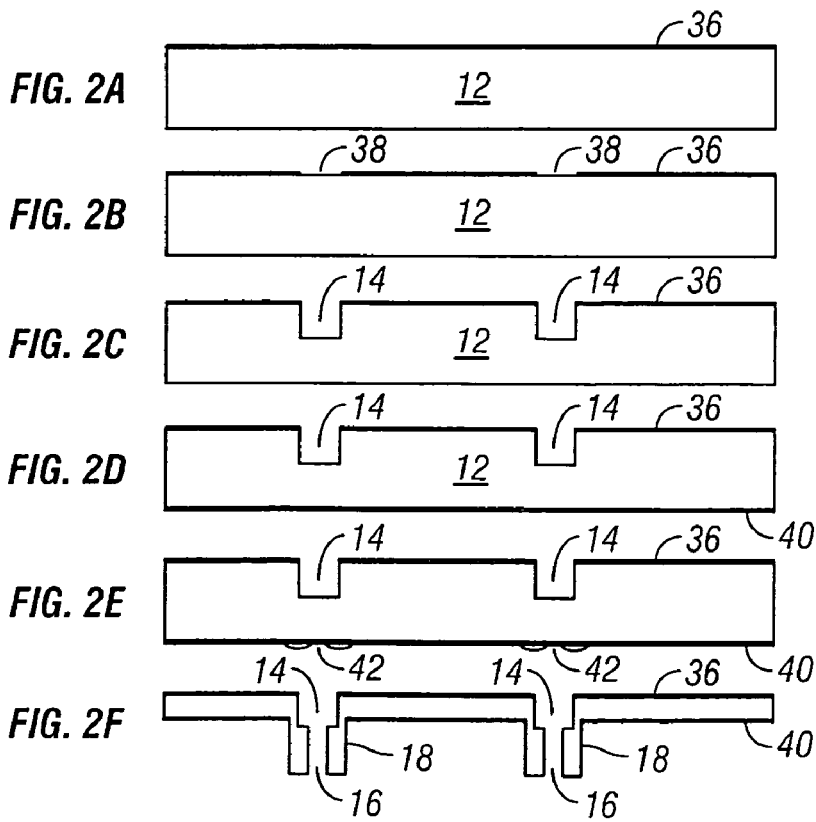

MICRO-MACHINED NOZZLES

BACKGROUND OF THE INVENTION

There are many applications where it is desirable to accurately transfer tiny discrete liquid droplets from a source to a work piece. Examples include the production of DNA/protein micro-arrays and the dispensing of liquid metals in the fabrication of electrical micro-switches. One approach employs the so-called pin transfer method. See U.S. Pat. No. 6,579,499 granted Jun. 17, 2003 to Kennedy et al. In another approach a minute amount of liquid can be passed through a micro-nozzle. As the liquid protrudes from an orifice in the micro-nozzle, surface tension causes a tiny droplet to be formed. By way of example, the droplet may have a volume of one micro-liter and the nozzle orifice may have a radius of five hundred microns. The droplet can touch the surface of the work piece and then the nozzle and the work piece can be pulled apart to transfer the droplet to the work piece. Transfer of tiny droplets usually will not occur solely on the basis of gravity because it is insufficient to overcome the forces associated with wetting of the liquid to the surface of the nozzle.

The efficiency of the liquid droplet transfer utilizing a micro-nozzle depends upon many factors, including the droplet size, the nozzle orifice shape, the contact angle and the wettability differences between the nozzle surface and the work piece surface. It is desirable to efficiently transfer a predetermined droplet size from the nozzle.

The dispensing of liquid metals in the fabrication of micro-switches is currently achieved using a solitary nozzle or a pluarality of individual nozzles. The diameter of the nozzle orifice and the wettability of the nozzle surface is tailored to control the size of the desired liquid droplet. Both the process of fabricating such nozzles and altering their wettability, either by modifying the nozzle surface chemistry or nozzle surface roughness, can be very costly, particularly when the size of the droplet decreases and the required number of nozzles increases. Currently micro-nozzles are commercially available from the Lee Company (http://www.theleeco.com) that are made of brass alloy. In many cases these are unsuitable for dispensing liquid metal, such as Mercury, as this liquid metal can be contaminated from the Copper contained in the brass alloy.

SUMMARY OF THE INVENTION

A micro-machined nozzle includes a substrate having a hole formed on a first side that extends partially through a thickness dimension of the substrate and a nozzle orifice formed on a second opposite side that communicates with the hole. The nozzle orifice has at least a portion of its interior wall serrated.

A method of fabricating a micro-machined nozzle includes the steps of etching a first side of a silicon substrate to form a hole that extends partially through a thickness dimension of the substrate and etching a second opposite side of the silicon substrate to form a serrated nozzle orifice that communicates with the hole.

BRIEF DESCRIPTION OF THE DRAWINGS

FIG. 1 is a diagrammatic vertical sectional view illustrating an array of micro-machined nozzles connected to a holder that forms a liquid reservoir in accordance with an embodiment of the present invention. Droplets are formed at the ends of the nozzles that are about to be transferred to a work piece positioned below the array.

FIGS. 2A–2F schematically illustrate a method of fabricating an array of micro-machined nozzles in accordance with an embodiment of the present invention.

DETAILED DESCRIPTION

Figure 3A:
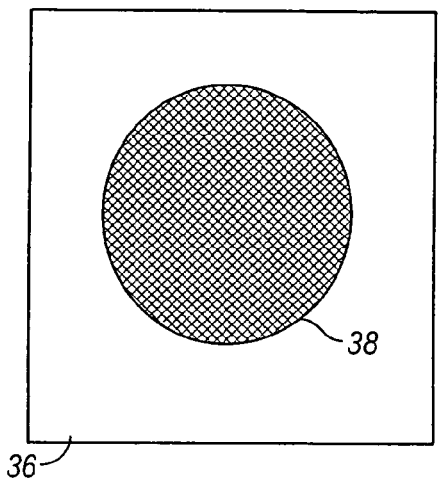
FIGS. 3A and 3B illustrate the configurations of hole and nozzle masks that may be used in connection with the method of fabrication illustrated in FIGS. 2A–2F.

Referring to FIG. 1, a micro-machined nozzle array 10 comprises a silicon substrate 12 etched on an upper first side 12a to provide a plurality of substantially cylindrical holes 14 that each extend partially through a thickness dimension of the silicon substrate 12. The silicon substrate 12 is etched on a lower second side 12b to provide a plurality of nozzle orifices 16 that each communicate with a corresponding hole 14. The lower second side 12b of the silicon substrate 12 is further etched to provide a plurality of substantially cylindrical exterior walls 18 that each surround a corresponding nozzle orifice 16. The nozzle orifices 16 each have a plurality of radially extending ridges 20 (FIG. 5) formed on an interior facing wall thereof. The configuration of the ridges 20 is used to predetermine the amount of liquid contact area, and thus the wettability of the nozzle surface.

A box-like nozzle holder 22 (FIG. 1) is attached to the silicon substrate 12 and provides a sealed liquid reservoir defining an interior chamber 24 between the holder 22 and the upper first side 12a of the silicon substrate 12. The interior chamber 24 holds a quantity of liquid 26 such as liquid metal. Liquid metals that may be dispensed with the nozzle array 10 include Mercury, Gallium alloys, Tin alloys and Indium alloys. However, it will be understood that the nozzle array 10 could be used to dispense a wide variety of aqueous and other liquids in biological and other applications.

A gas port 28 and a liquid port 30 are provided in the nozzle holder 22 via suitable openings and fittings, which preferably include check valves (not illustrated). An inert gas may be supplied via the gas port 28 to force a portion of the liquid 26 through the nozzle orifices 16 to form minute droplets 32. The droplets 32 can be simultaneously transferred to the upper side of a work piece 34 by contacting the droplets 32 with the work piece 34 and subsequently separating the nozzle array 10 and the work piece 34 as indicated by the arrows in FIG. 1. The workpiece 34 may be moved downwardly, or the nozzle array 10 may be moved upwardly. It may not even be necessary to separate the nozzle array 10 and work piece 34 in order to transfer the droplets 32.

Micro-fabricating the nozzle array 10 takes advantage of photolithography to predetermine the precise location, configuration and size of the nozzle orifices 16 with very tight tolerances not attainable by traditional metal machining or plastic injection molding. The nozzle array 10 can be micro-fabricated with a pitch between adjacent nozzle orifices 16 that is so small that it could not be readily attained with machining and molding techniques. This small pitch is desirable, for example, when forming a dense array of micro-switches with liquid metal. Micro-fabricating the nozzle array 10 from silicon also allows many contamination issues to be avoided. Silicon has a very low solubility in Mercury and does not form a stable inter-metallic. This improves the purity of liquid metals dispensed from the nozzle array 10, and the reliability of devices fabricated with such liquid metal. Photolithography permits the size and shape of the ridges 20 to be well controlled, thus allowing the wettability of the nozzle orifices 16 to be precisely predetermined. If the wettability of the nozzle orifices 16 is too high an insufficient and/or uncontrolled amount of liquid will be dispensed or it might be difficult to transfer any liquid. The wettability of the nozzle orifices 16 can be controlled by carefully adjusting the roughness of the surfaces of the nozzle orifices as disclosed in "Dynamic Wettability Switching by Surface Roughness Effect", He et al., Proceedings of the IEEE Micro Electro Mechanical Systems (MEMS), 2003, pp 120–123. By way of example, the nozzle orifices 16 may have a diameter of fifty micro-meters.

FIGS. 2A–2F schematically illustrate a method of fabricating the array 10 of micro-machined nozzles. Fabrication of the nozzle array 10 involves two photolithography steps, two etch mask etch steps, and two deep etch steps. Initially an etch mask 36 (FIG. 2A) is deposited onto the upper first side 12a of the planar silicon substrate 12 which may take the form of a polished silicon wafer. An external coating of silicon dioxide (not illustrated) may be deposited or formed on the silicon wafer by thermal oxidation before depositing the etch mask 36. A pair of holes 38 (FIG. 2B) are then formed in the etch mask 36 using standard photolithography techniques. FIG. 3A illustrates the configuration of the etch mask 36 for a single one of the holes 38, it being understood that the shaded areas represent regions of silicon that will be removed via subsequent etching. A deep etch of the substrate 12 is then conducted on the upper side 12a of the silicon substrate 12 via suitable technique, such as deep reactive ion etching (DRIE) to form the cylindrical holes 14 (FIG. 2C). Laser etching or laser assisted chemical etching could also be utilized. Preferably the holes 14 extend partially through the vertical thickness dimension of the silicon substrate 12 from about one-quarter to about three-quarters of that dimension.

Figure 3B:
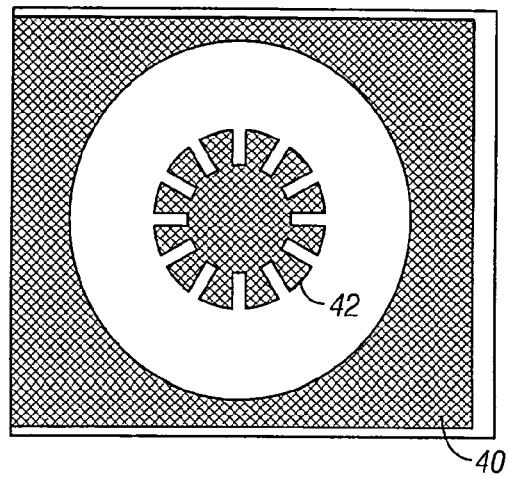

FIG. 2D illustrates the deposition of an etch mask 40 onto the lower second side 12b of the planar silicon substrate 12. A pair of ribbed holes 42 (FIG. 2E) are then formed in the etch mask 40 using standard photolithography techniques. FIG. 3B illustrates the configuration of the etch mask 40 for a single one of the ribbed holes 42. Once again it will be understood that the shaded areas represent regions of silicon that will be removed via subsequent etching. A deep etch of the lower side 12b of the silicon substrate 12 is then conducted via DRIE to form the nozzle orifices 16 (FIG. 2C). The nozzle orifices 16 connect with the holes 14. The same etching step removes material from around the nozzle orifices 16 to form the substantially cylindrical exterior walls 18. The depth of this etch dictates the height of the nozzles that include the orifices 16.

Figure 4A:
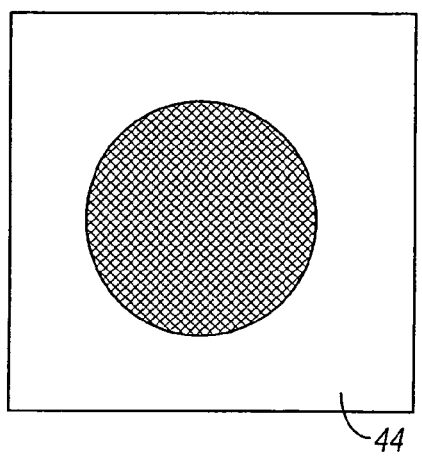
FIGS. 4A and 4B illustrate alternate configurations of the hole and nozzle masks that may be used in connection with the method of fabrication illustrated in FIGS. 2A–2F.
Figure 4B:
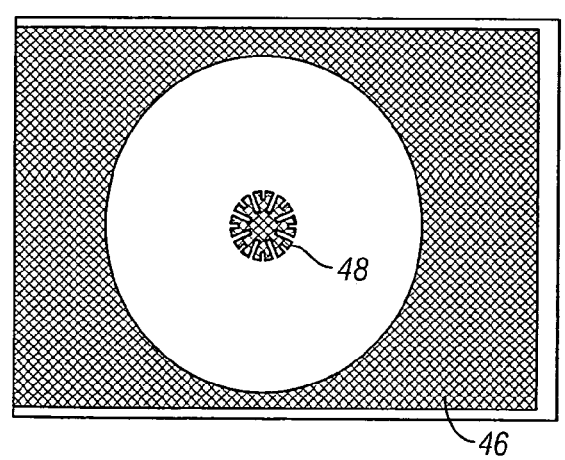

FIGS. 4A and 4B illustrate the configurations of alternate hole and nozzle masks 44 and 46, respectively, that may be used in connection with the method of fabrication illustrated in FIGS. 2A–2F. The nozzle mask 46 produces a nozzle orifice with a pattern 48 that is serrated around its entire circumference with a plurality of radially extending ridges. Half of the ridges have a first long radial length and the other half have a second short radial length. The lengths of the ridges alternates between the first and second lengths such that each short ridge is positioned between two longer ridges.

The wettability of the surfaces of the nozzle orifices 16 can be further altered by removing the etch mask 40, oxidizing the interior surfaces of the nozzle orifices 16 or by depositing a thin film of material on the interior surfaces of the nozzle orifices 16 such as silicon dioxide or silicon nitride.

Figure 5:
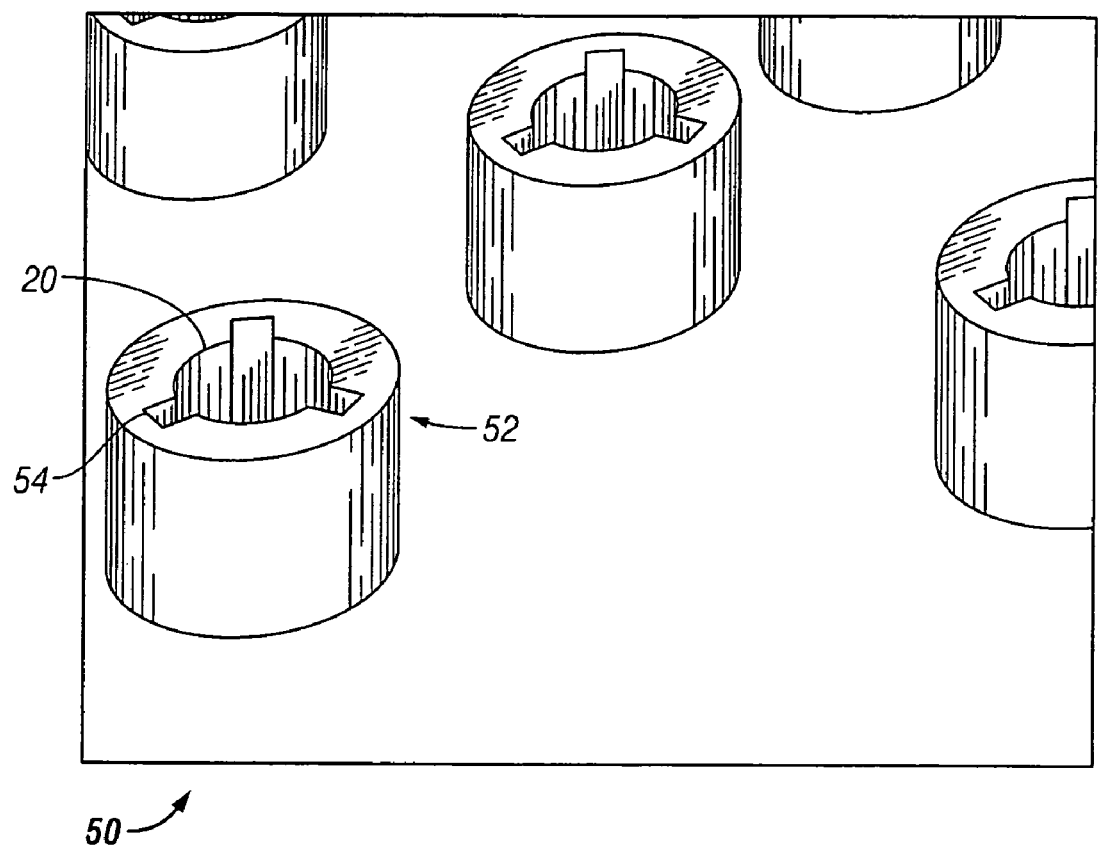
FIG. 5 is a perspective view of an alternate embodiment of an array of micro-machined nozzles.

FIG. 5 is a perspective view of an alternate embodiment of an array 50 of five identical micro-machined nozzles 52 having serrated orifices defined by three rectangular indentations 54 spaced one hundred and twenty degrees apart in otherwise interior cylindrical walls. The ridges 20 extend radially inwardly between the indentations 54.

While we have described embodiments of our micromachined nozzle and its method of fabrication, variations and modifications thereof will occur to those skilled in the art. For example, the serrations could be uniform, nonuniform, saw-toothed, rectangular, curved, etc., it being understood that what is required is to vary the wettability of the surfaces of the nozzle orifices is some pattern of recesses and projections to break up what would otherwise be a smooth interior wall. Other substrates besides silicon could be used, such as glass or Titanium, that can be etched with sufficient resolution. Therefore the protection afforded our invention should only be limited in accordance with the following claims.

We claim:

1. A micro-machined nozzle, comprising:
   a substrate having a hole formed on a first side that extends partially through a thickness dimension of the substrate and a nozzle orifice formed on a second opposite side that communicates with the hole, wherein the nozzle orifice is serrated around its entire interior circumference with a plurality of ridges and wherein the ridges have a first long radial length and a second short radial length, the lengths of the ridges alternating between the first and second lengths such that each short ridge is positioned between two longer ridges.

2. The nozzle of claim 1 wherein the second side of the substrate is formed with a substantially cylindrical exterior wall that surrounds the nozzle orifice.

3. The nozzle of claim 1 and further comprising a nozzle holder that supports the substrate.

4. The nozzle of claim 1 and further comprising a liquid reservoir attached to the substrate and defining an interior chamber communicating with the nozzle orifice.

5. The nozzle of claim 1 wherein the hole is substantially cylindrical.

6. The nozzle of claim 1 and further comprising a nozzle holder attached to the substrate that provides a liquid reservoir defining an interior chamber between the holder and the first side of the substrate.

7. The nozzle of claim 1 wherein the substrate is made of silicon.

8. The nozzle of claim 1 wherein the serrated portion of the inner wall has a plurality of radially extending ridges.

9. A method of fabricating a micro-machined nozzle, comprising the steps of:
   etching a first side of a silicon substrate to form a hole that extends partially through a thickness dimension of the substrate; and
   etching a second opposite side of the silicon substrate to form a nozzle orifice that communicates with the hole, wherein the nozzle orifice is serrated around its entire interior circumference with a plurality of ridges, the ridges having a first long radial length and a second short radial length, the lengths of the ridges alternating between the first and second lengths such that each short ridge is positioned between two longer ridges.

10. The method of claim 9 wherein the hole is substantially cylindrical.

11. The method of claim 9 land further comprising the step of etching the second side of the silicon substrate to form a substantially cylindrical exterior wall that surrounds the nozzle orifice.

12. The method of claim 9 wherein the serrated portion of the inner wall has a plurality of radially extending ridges.

13. The method of claim 9 wherein the hole is etched on the first side of the silicon substrate by depositing an etch mask, patterning the etch mask and deep etching the first side of the silicon substrate.

14. The method of claim 9 wherein the nozzle orifice is etched on the second side of the silicon substrate by depositing an etch mask, patterning the etch mask and deep etching the second side of the silicon substrate.

15. The method of claim 9 wherein the hole is etched on the first side of the silicon substrate by depositing a first etch mask, patterning the first etch mask, and deep etching the first side of the silicon substrate, and the nozzle orifice is etched on the second side of the silicon substrate by depositing a second etch mask, patterning the second etch mask, and deep etching the second side of the silicon substrate.

16. The method of claim 9 and further comprising the step of attaching a holder to the silicon substrate to form a liquid reservoir defining an interior chamber between the holder and the first side of the silicon substrate.

17. A micro-machined nozzle array, comprising:

a silicon substrate etched on a first side of the silicon substrate to provide a plurality of holes that each extend partially through a thickness dimension of the substrate, etched on a second side of the silicon substrate to provide a plurality of nozzle orifices that each communicate with a corresponding hole, and further etched on the second side of the silicon substrate to provide a plurality of substantially cylindrical exterior walls that each surround a corresponding nozzle orifice, wherein each nozzle orifice is serrated around its entire interior circumference with a plurality of radially extending ridges and wherein the ridges have a first long radial length and a second short radial length, the lengths of the ridges alternating between the first and second lengths such that each short ridge is positioned between two longer ridges; and a nozzle holder attached to the silicon substrate that provides a liquid reservoir defining an interior chamber between the holder and the first side of the silicon substrate.

* * * * *

UNITED STATES PATENT AND TRADEMARK OFFICE
CERTIFICATE OF CORRECTION

PATENT NO. : 7,158,159 B2 Page 1 of 1
APPLICATION NO. : 11/003067
DATED : January 2, 2007
INVENTOR(S) : Beerling et al.

It is certified that error appears in the above-identified patent and that said Letters Patent is hereby corrected as shown below:

In column 5, line 5, in Claim 11, delete "land" and insert -- and --, therefor.

Signed and Sealed this

Sixth Day of May, 2008

JON W. DUDAS
*Director of the United States Patent and Trademark Office*